United States Patent [19]

Higgins, III

[11] Patent Number: 5,686,352
[45] Date of Patent: Nov. 11, 1997

[54] METHOD FOR MAKING A TAB SEMICONDUCTOR DEVICE WITH SELF-ALIGNING CAVITY AND INTRINSIC STANDOFF

[75] Inventor: Leo M. Higgins, III, Austin, Tex.

[73] Assignee: Motorola Inc., Schaumburg, Ill.

[21] Appl. No.: 509,442

[22] Filed: Jul. 31, 1995

Related U.S. Application Data

[63] Continuation of Ser. No. 96,539, Jul. 26, 1993, abandoned.

[51] Int. Cl.[6] .................... H01L 21/56; H01L 21/58; H01L 21/603
[52] U.S. Cl. .................... 437/182; 437/211; 437/217; 437/220
[58] Field of Search .................... 437/182, 206, 437/207, 211, 215, 217, 220; 257/676, 680, 688, 696, 668, 666; 228/180.21; 361/749, 813; 29/827

[56] References Cited

U.S. PATENT DOCUMENTS

| | | | |
|---|---|---|---|
| 4,038,744 | 8/1977 | Cheype et al. | 29/628 |
| 4,312,117 | 1/1982 | Robillard et al. | 437/182 |
| 4,801,999 | 1/1989 | Hayward et al. | 357/70 |
| 4,912,547 | 3/1990 | Bilowith et al. | 357/80 |
| 4,939,570 | 7/1990 | Bickford et al. | 357/81 |
| 4,948,645 | 8/1990 | Holzinger et al. | 428/40 |
| 5,046,706 | 9/1991 | Ueda et al. | 437/207 |
| 5,065,504 | 11/1991 | Olla | 29/827 |
| 5,075,252 | 12/1991 | Schendelman | 437/207 |
| 5,076,485 | 12/1991 | MacKay | 228/177 |
| 5,166,099 | 11/1992 | Ueda et al. | 437/220 |
| 5,170,930 | 12/1992 | Dolbear et al. | 228/123 |
| 5,229,328 | 7/1993 | Bregman et al. | 437/209 |
| 5,266,520 | 11/1993 | Cipolla et al. | 437/183 |

FOREIGN PATENT DOCUMENTS

| | | | |
|---|---|---|---|
| 52-35581 | 3/1977 | Japan | 437/217 |
| 61-141147 | 6/1986 | Japan | 437/182 |
| 62-30342 | 2/1987 | Japan | 257/666 |
| 63-86443 | 4/1988 | Japan | 437/217 |
| 1-19737 | 1/1989 | Japan | 437/206 |
| 1-47038 | 2/1989 | Japan | 437/182 |
| 2215145 | 8/1990 | Japan | 437/215 |
| 547847 | 2/1993 | Japan | 228/180.21 |

*Primary Examiner*—David Graybill
*Attorney, Agent, or Firm*—Minh-Hien N. Clark; Patricia S. Goddard

[57] ABSTRACT

A TAB semiconductor device (98) is manufactured with a TAB tape (62') which provides an intrinsic standoff for the device. The tape (62') has a carrier film (66'), having at least one cavity, and a plurality of conductors (64) on the top surface of the carrier film. A semiconductor die (42) is substantially centered either inside or below the cavity in the film. The conductors overlie bonding sites (44) on the active surface of the die. Inner-lead-bonds are made between the conductors and the bonding sites, wherein the conductors bend at the edges (65') of the cavity in order to contact the bonding sites, thus concurrently achieving a downset during the action of bonding. An encapsulant (99) provides protection to the die, the inner-lead-bonds, and a portion of the conductors.

14 Claims, 3 Drawing Sheets

METHOD FOR MAKING A TAB SEMICONDUCTOR DEVICE WITH SELF-ALIGNING CAVITY AND INTRINSIC STANDOFF

This application is a continuation of prior application Ser. No. 08/096,539, filed Jul. 26,1993, abandoned.

FIELD OF THE INVENTION

This invention relates to a semiconductor device in general, and more specifically to a tape automated bonding (TAB) semiconductor device having a carrier film as an intrinsic standoff.

BACKGROUND OF THE INVENTION

In a TAB semiconductor device, either the semiconductor die or the TAB tape is typically bumped to facilitate inner-lead-bonding. Inner-lead-bonding is a term in the art to describe the bonds between the bonding sites on the semiconductor die to the TAB leads or conductors on the TAB tape. In the case of a bumped die, the bumping process is typically performed at the wafer level. Bumping involves the deposition of several layers of metal on top of aluminum or aluminum-alloy bonding pads on the semiconductor die to provide low contact resistance and adhesion to the pads and to prevent inter-diffusion of metal species which would form metal phases with undesirable properties. A TAB bump generally includes an adhesion/diffusion barrier layer, such as titanium, tungsten, titanium tungsten alloys, nitrogen containing phases of titanium and/or tungsten, chromium, platinum, palladium; and a bonding layer, such as gold. The adhesion layer is chosen to make good electrical contact to the aluminum bonding pad as well as the passivation layer surrounding the pad. The barrier layer prevents unwanted inter-diffusion bonding between several metals of the TAB bump. The bonding layer is typically a noble metal, such as gold, to provide an inert surface for bonding or plating. Thus, it is apparent that the cost of bumping a wafer can add significant cost to a TAB semiconductor device. Likewise, the cost of bumping the TAB tape also adds significant cost to a TAB device.

A lowest cost alternative to wafer bumping is to TAB bond directly to the aluminum or aluminum-alloy pads on the semiconductor die, thus eliminating the bumping process and its associated cost. However, passivation damage is a risk when TAB bonding directly to a bonding pad, as illustrated in FIG. 1. Moreover, bumpless TAB bonding typically mandates single point bonding which is less efficient than gang bonding, wherein all of the inner-lead-bonds are made in a single step. FIG. 1 illustrates, in cross-section, an inner-lead-bonding step 40 where semiconductor die 42 has a passivation layer 46 over the active surface of the die, but the bonding pad 44 is exposed. A TAB lead or conductor 20 is supported by a work holder 32 which also supports the semiconductor die 42 in a cavity. The TAB lead 20 is supported further away from the die 42 by a polyimide layer 22. The gap between the die edge and the polyimide layer 22 typically ranges from 0.2 to 1 millimeter. A single point bond tool or thermode 48 bonds the tip of conductor 20 to the bonding pad 44. Good alignment between the conductor, the bond pad, and the thermode become critical with single point bonding. Otherwise, the bond pad or the passivation layer may become damaged. Furthermore, misalignment may cause the inner-lead-bond to have poor adhesion characteristics which may cause the bond to fail during temperature cycling. Even with good alignment, risk of passivation damage exists at the edges 50 of the passivation 46.

A common practice in assembling a TAB semiconductor device, known as downsetting, involves bending the TAB leads away from the die to avoid shorting to the semiconductor die edge. Downsetting is often performed as an additional step in assembly after the inner-lead-bonds are made, which requires separate tooling and adds to the assembly cost of the device. Another common downsetting method involves the elevation of the tape above the die during the bonding process. During bonding, the lead is plastically deformed downward, creating a low angle downset since the element resisting lead bending is simply the edge of the carrier film underlying (or overlying depending on tape orientation during bonding) the copper leads, and this carrier film is quite flexible. The polyimide substrate is quite far from the bond pad. This low angle is usually acceptable for a bumped die, but not bumpless pads due to the loss of lead elevation from the die edge provided by the bump. Additionally, damage to the inner-lead-bonds is a risk with a separate downsetting step. Moreover, a customized downset die must be tooled for individual semiconductor die sizes. Some downsetting practice involves offsetting the TAB tape approximately 0.2 to 2 millimeters above the semiconductor die and using a tool to downset the leads and make the inner-lead-bonds in one operation. However, a disadvantage in this practice is that the offset must be provided by the tooling that supports the semiconductor die and the TAB tape. The amount of offset must be controlled so that the offset is not too high because the TAB leads skew laterally easily. Conversely, the offset cannot be too low because the leads must be deformed beyond their elastic limit to retain the downset.

Thus, it is desirable, to be able to TAB bond directly to bonding pads on a semiconductor die without the previously mentioned disadvantages.

SUMMARY OF THE INVENTION

The invention provides a TAB semiconductor device having an intrinsic standoff and a method for making the same. A semiconductor die having a plurality of bonding sites on an active surface is provided. A TAB tape having a carrier film, at least one cavity in the carrier film, and a plurality of conductors on a top surface of the carrier film is also provided. The semiconductor die is substantially centered either inside or below the at least one cavity, wherein the plurality of conductors extends beyond the edges of the at least one cavity to overlie the bonding sites on the active surface of the semiconductor die. The active surface of the semiconductor die and the top surface of the carrier film occupy different but substantially parallel planes such that the edges of the at least one cavity in the carrier film provide an intrinsic standoff for the plurality of conductors. Inner-lead-bonds are made between the plurality of conductors and the plurality of bonding sites, wherein the conductors bend at the edges of the least one cavity in the carrier film in order to contact the plurality of bonding sites, thus concurrently downsetting the conductors during the action of bonding. An encapsulant is then dispensed over the active surface of the semiconductor die to protect the active surface, the inner-lead-bonds, and a portion of the plurality of conductors. The invention also provides a structure made by the same method.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIGS. 1–8 incorporate many of the same or similar elements. Therefore, like reference numerals designate identical or corresponding parts throughout the several views.

DETAILED DESCRIPTION OF A PREFERRED EMBODIMENT

Figure 1:
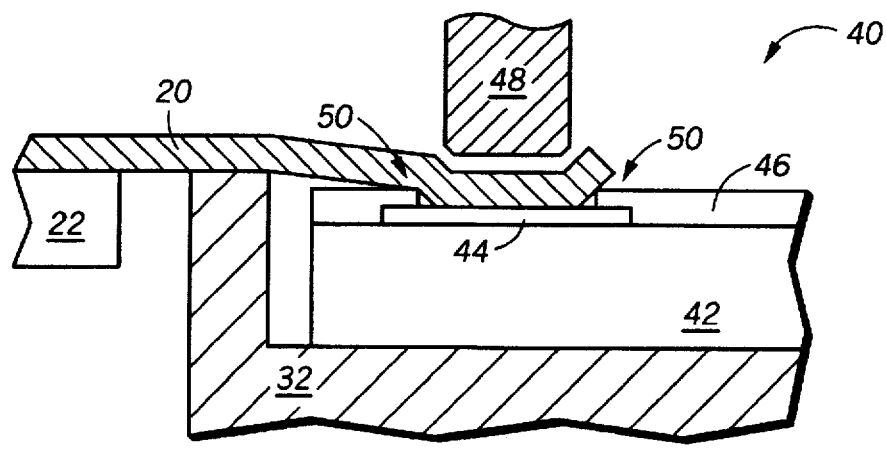
FIG. 1 illustrates, in cross-section, a process step in the prior art for single point inner-lead-bonding a TAB conductor to an aluminum bonding pad on a bumpless semiconductor die.
Figure 2:
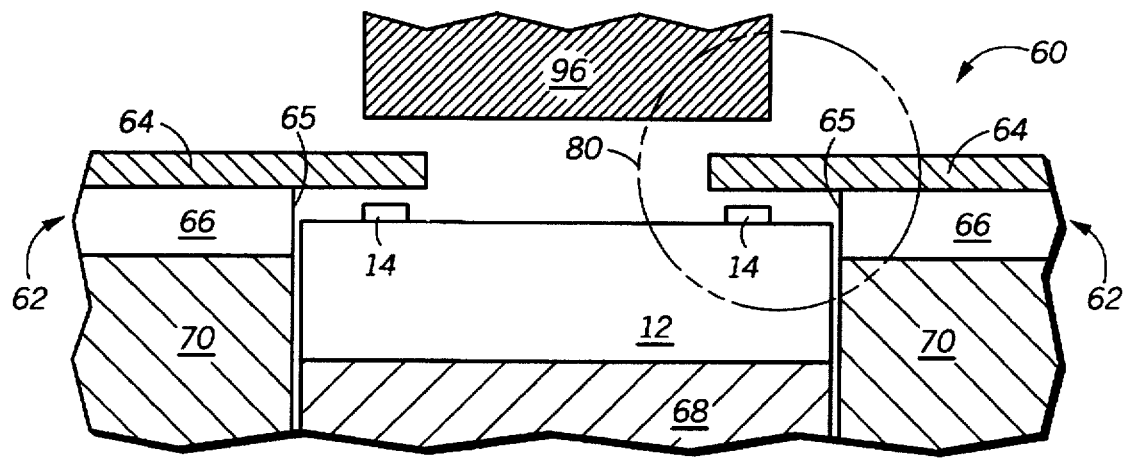
FIG. 2 illustrates, in cross-section, a process step for inner-lead-bonding TAB conductors to a semiconductor die using a self-aligning cavity TAB tape, in accordance with a first embodiment of the invention.

FIG. 2 illustrates, in cross-section, a process step 60 for inner-lead-bonding and downsetting in a TAB semiconductor device, in accordance with a first embodiment of the invention. A self-aligning cavity TAB tape 62 provides an intrinsic standoff during the inner-lead-bonding process. As illustrated, a semiconductor die 12 having a plurality of TAB bumps 14 on its active surface is supported by a die support 68. Bumps 14 are the bonding sites for the inner-lead-bonds. The bonding pads (not shown) of the semiconductor die are plated with several layers of metal to form the bumps 14. The exact metallurgy of the bumps may vary according to the type of semiconductor die and the desired interfacial metallurgy although the top layer of metal is typically gold. While FIG. 2 illustrates a bumped semiconductor die, it should be understood that this embodiment of the invention can also be used in conjunction with a bumpless die.

The self-aligning cavity TAB tape 62 is composed of a carrier film 66 and a plurality of conductors 64 on a top surface of the carrier film. Carrier film 66 is a flexible nonconductive film, typically polyimide although polyester or liquid crystal polymers may also be used, while the conductors 64 are of a conductive alloy, such as copper or plated copper. The carrier film 66 has a cavity to accommodate the semiconductor die 12. The cavity may be etched into the carrier film 66 during manufacturing of the TAB tape 62 using conventional etching techniques, or the cavity may be mechanically punched. The conductors 64 extend beyond the edges 65 of the cavity to overlie the bonding sites 14 on the active surface of the semiconductor die 12. The semiconductor die is supported by a work holder or die support 68, which may be heated to preheat the semiconductor die prior to the step of inner-lead-bonding to minimize thermal shock to the die. Thermocompression or thermosonic bonding is normally performed at a high temperature, 200° C. to 600° C., so an unheated semiconductor die may experience a rapid temperature ramp during inner-lead-bonding. A separate work holder or tape support 70 supports the TAB tape 62. Tape support 70 may have vacuum lines (not illustrated) therein to rigidly hold the TAB tape 62 in place during inner-lead-bonding to minimize skew of the conductors 64. A bond tool 96 thermocompression or thermosonically bonds the tips of the TAB leads or conductors 64 to the bumps 14.

Figure 3:
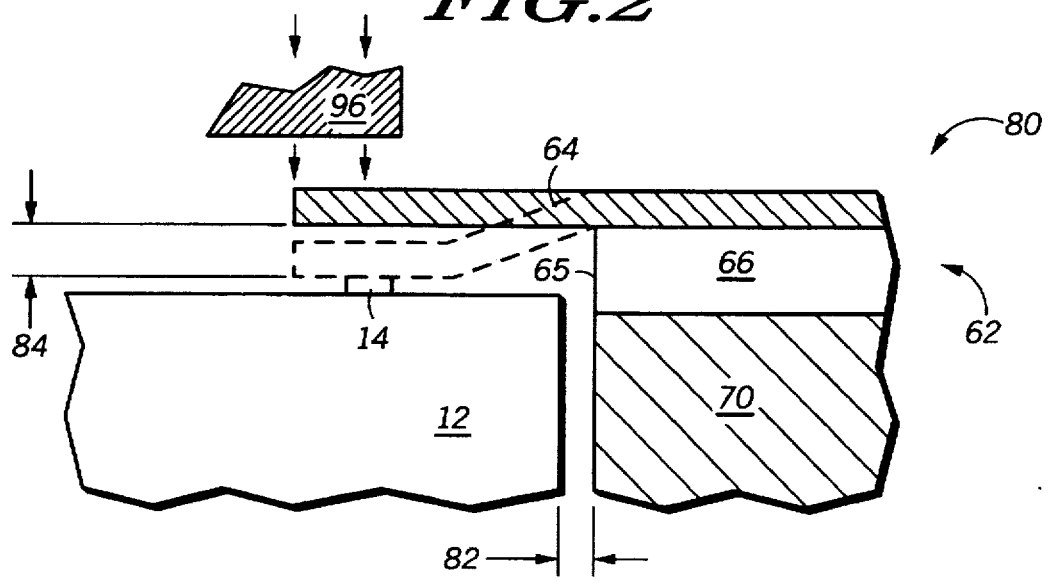
FIG. 3 illustrates, in cross-section, an enlarged view of a TAB conductor of FIG. 2 overlying a TAB bump with the carrier film providing an intrinsic standoff in the inner-lead-bonding process.

The cavity in the carrier film 66 of the TAB tape 62 is designed to be only slightly larger than the semiconductor die 12. A more detailed illustration of the area 80 is shown in FIG. 3. An alignment gap 82 between the edge 65 of the cavity in the carrier film 66 and the edge of the semiconductor die 12 provides the self-aligning feature of the first embodiment of the invention. By substantially centering the semiconductor die 12 within the cavity, the TAB leads 64 automatically align with the bonding sites 14 on the active surface of the semiconductor die 12. Precise alignment of the conductors 64 over the bonding sites 14 is not critical, however, since the semiconductor die is bumped. A maximum offset of one-half of a lead width yields an acceptable joint at the inner-lead-bond. It is obvious that this self-aligning feature would be especially advantageous with a bumpless semiconductor die. However, precise alignment is more important in the case of bumpless inner-lead-bonding, where no lead to pad misalignment is permitted. The lead tip must be 100% within the bond pad passivation opening. The self-aligning feature of this embodiment automatically forces the leads to align to the bonding sites. The smaller the alignment gap 82 becomes, the more precise the alignment becomes. An alignment gap in the range of 0.02 to 0.06 millimeter is recommended. It is critical that the tape vendor have a tight control in the registration of copper conductor features to polyimide film features.

As illustrated in FIGS. 2 and 3, the TAB tape 62 is offset from the semiconductor die 12 such that the top surface of the carrier film 66 and the active surface of the semiconductor die are on non-coplanar but substantially parallel planes. The offset can be on the order of 50 to 125 microns, which will typically provide a 25 to 100 microns downset. The TAB conductors 64 are on the top surface of the carrier film 66 and are thus elevated above the active surface of the die. The thickness of carrier film 66 in conjunction with height adjustments between tooling 68 and 70 provides the desired standoff. The bond tool 96, typically a hot thermode, applies pressure between the TAB conductors 64 and the bumps 14 to inner-lead-bond the conductors to the semiconductor die 12. This thermocompression bonding step can either single point or gang bonding, although gang bonding is obviously advantageous in terms of cycle time. Thermosonic bonding would be used for single point bonding, and even gang bonding in some cases. The carrier film 66 provides an intrinsic standoff for the conductors 64 such that the conductors 64 bend at the edge 65 of the cavity for a built-in downsetting operation. The offset or standoff 84 between the conductors 64 and the bonding site 14 should be such that during inner-lead-bonding, the conductors are deformed beyond their elastic limit so that the spring back, after the pressure from the hot thermode 96 is released, is minimized.

Figure 4:
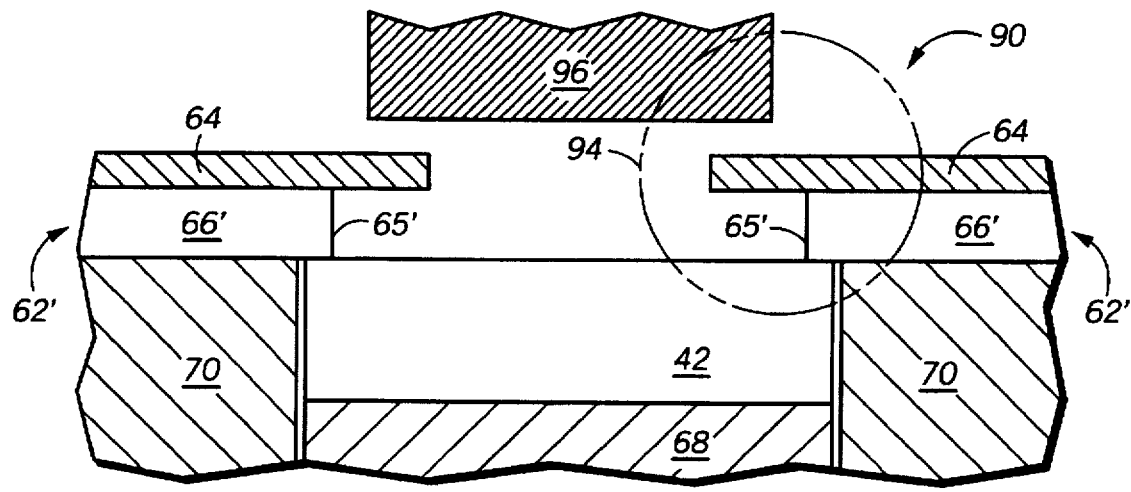
FIG. 4 illustrates, in cross-section, a process step for inner-lead-bonding TAB conductors to a semiconductor die, in accordance with a second embodiment of the invention.
Figure 5:
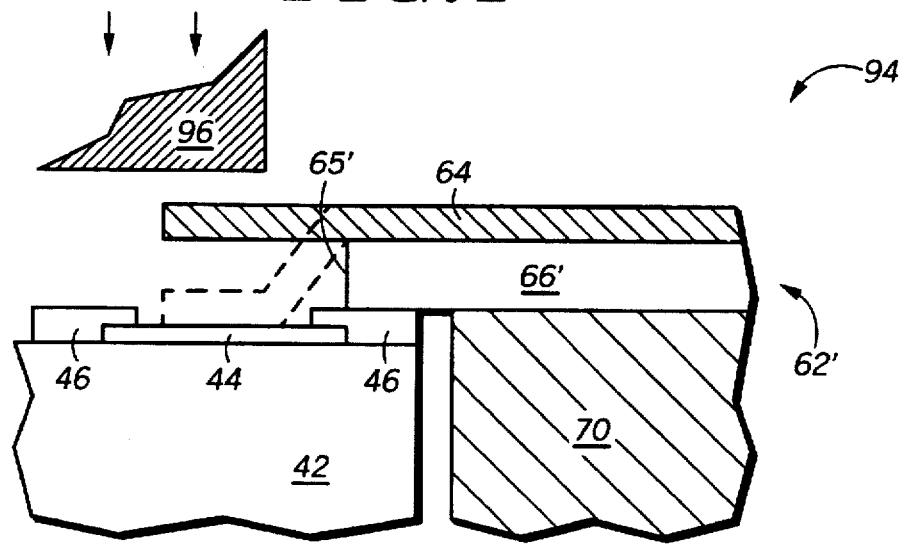
FIG. 5 illustrates, in cross-section, an enlarged view of a TAB conductor of FIG. 4 overlying a bonding pad with the carrier film providing an intrinsic standoff in the inner-lead-bonding process.
Figure 6:
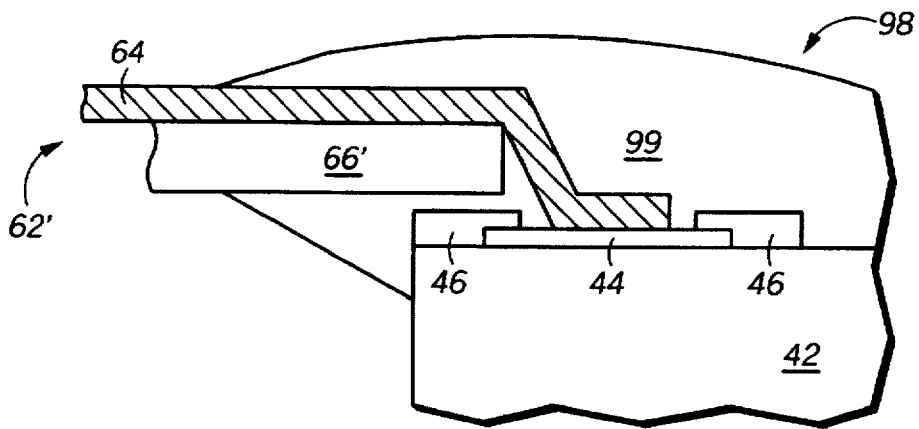
FIG. 6 illustrates, in cross-section, an encapsulant covering the inner-lead-bonds and the active surface of the semiconductor die, in accordance with the second embodiment of the invention.

FIGS. 4-6 illustrate, in cross-section, process steps for forming a TAB semiconductor device 98 in accordance with a second embodiment of the present invention. FIG. 4 illustrates a TAB tape 62'having a carrier film 66'and a plurality of conductors 64 on the top surface of the carrier film. In this embodiment, the cavity in carrier film 66'is smaller than the semiconductor die 42 so that a bottom surface of the carrier film 66'overlies a periphery of the semiconductor die 42 not including the bonding sites. The top surface of the carrier film 66'and the active surface of the semiconductor die occupy non-coplanar but substantially parallel planes. The thickness of the carrier film 66' intrinsically provides a standoff or offset for the conductors 64. The conductors 64 extend beyond the edge 65'of the cavity in carrier film 66' to overlie bonding sites (not illustrated in FIG. 4) on the active surface of the semiconductor die 42.

In the detailed view in FIG. 5, the edge of the semiconductor die 42 is illustrated to show a bonding pad 44 and a passivation layer 46. Many semiconductor dice have some type of protective passivation layer, such as glass or polyimide, on the active surface of the dice where only the bonding pads are exposed for electrical connections. Bonding pad 44 is typically aluminum or aluminum-alloy. Die support 68 and tape support 70 physically support the semiconductor die and the TAB tape, respectively, during the inner-lead-bonding and downsetting step. The die support 68 may be also be heated to bring the semiconductor die to a temperature closer to the inner-lead-bonding temperature so that thermal stress associated with the process is reduced. Furthermore, the tape support 70 may also have vacuum lines (not illustrated) therein to rigidly hold the TAB tape in place during the inner-lead-bonding process.

A conductor 64 extends beyond the edge 65'of the cavity in the carrier film 66' to overlie the bonding pad 44 on the active surface of the semiconductor die. Since the cavity is smaller than the semiconductor die, this embodiment of the invention is not self-aligning. Alignment of the conductors over the bonding sites is equipment dependent in this embodiment. Gang bonding, or single point bonding, of the inner leads is performed with a thermode or bond tool 96. The thermode 96 exerts a pressure on the conductor 64 to bring it into contact with the bonding pad 44. Downsetting is accomplished concurrently because the conductor 64 bends at the edge 65' of the cavity in order to contact the bonding pad 44. Thermocompression and thermosonic bonding are well known processes in the art. However, by using the edge 65'of the cavity in carrier film 66' to provide an intrinsic standoff for the conductors 64, a separate downsetting operation is eliminated. This reduces cycle time and tooling cost for the downsetting process, plus additional handling and potential lead skew damage associated with the downsetting process is avoided.

Illustrated in FIG. 6 is a partial cross-sectional view of an encapsulated TAB semiconductor device 98. After the step of inner-lead-bonding as illustrated in FIGS. 4 and 5, the carrier film 66' has a tendency to spring-back due to its elastic nature to leave a gap between the active surface of the semiconductor die and the bottom surface of the carrier film. If a vacuum is used in the tape support 70 during inner-lead-bonding, the carrier film 66' may experience more pronounced spring-back after the vacuum is deactivated. This spring back in the carrier film 66' is not detrimental to the integrity of the inner-lead-bond joint. An encapsulating material 99 can be dispensed over the active surface of the die and a portion of the TAB tape. A fluid epoxy, containing a solvent, is preferred for the encapsulant, such as a TAB coating material. The encapsulant flows between that gaps in the conductors 64 to cover the bottom surface of the TAB tape 62' including the carrier film 66' and the underside of the conductors 64. The encapsulant 99 also covers portions of the edges of the semiconductor die. The gap due to the spring-back of the carrier film 66'is filled with the encapsulating material 99 so that the semiconductor die is protected. The encapsulant's adhesion to the continuous carrier film all around the semiconductor die more evenly distributes stress and improves lead reliability for the device. The inner-lead-bonds are also strengthened.

Figure 7:
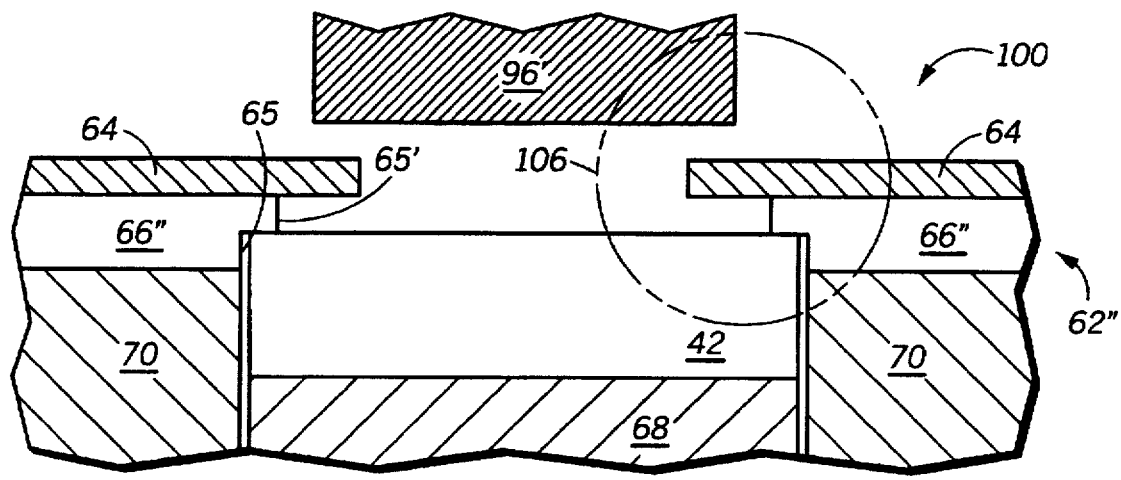
FIG. 7 illustrates, in cross-section, a process step for inner-lead-bonding TAB conductors to a semiconductor die using a self-aligning cavity TAB tape, in accordance with a third embodiment of the invention.
Figure 8:
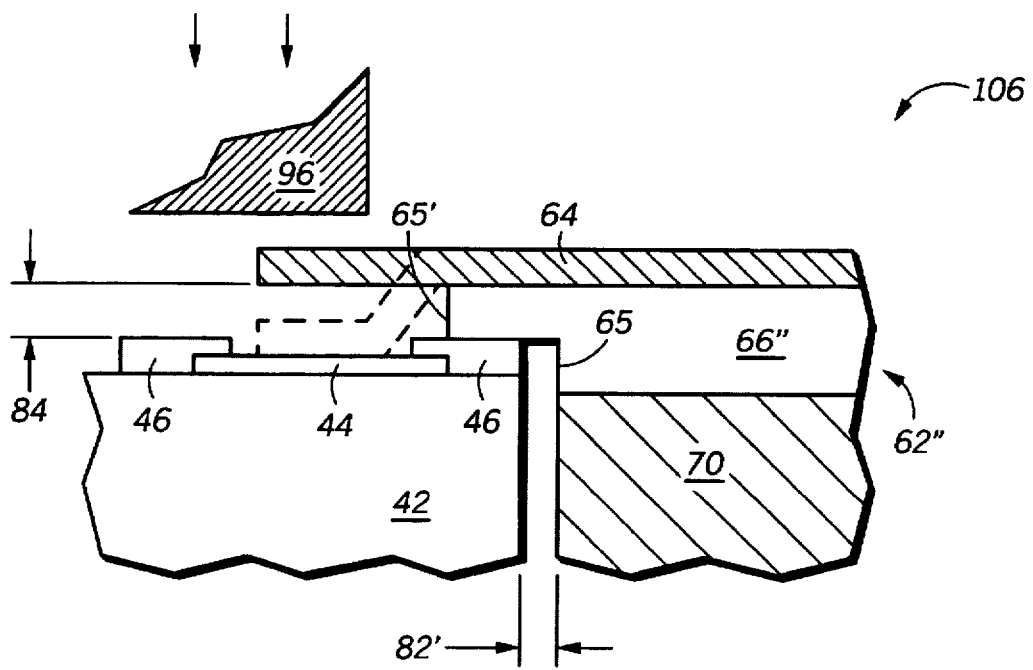
FIG. 8 illustrates, in cross-section, an enlarged view of a TAB conductor of FIG. 7 overlying a bonding pad with the stair-stepped carrier film providing an intrinsic standoff in the inner-lead-bonding process.

FIG. 7 illustrates, in cross-section, a process step 100 for inner-lead-bonding and downsetting in a TAB semiconductor device, in accordance with a third embodiment of the invention, while FIG. 8 illustrates the area 106 in more detail. A self-aligning stair-stepped cavity TAB tape 62" provides an intrinsic standoff during the inner-lead-bonding process. In this third embodiment, the carrier film 66"has two concentric die cavities creating the stair-stepped cavity feature. The first cavity has an alignment gap 82' to substantially self-align the semiconductor die within the first cavity. By substantially centering the semiconductor die 12 within the first cavity, the TAB leads 64 self-align with the bonding sites 44 (illustrated in FIG. 8) on the active surface of the semiconductor die. An alignment gap in the range of 0.02 to 0.06 millimeter is preferred. To achieve the stair-stepped concentric cavities, the second cavity can be etched through the carrier film 66" first. The backside of the carrier film 66" is then partially etched through part of the thickness of the carrier film to form the larger cavity.

The second cavity is smaller in size than the semiconductor die so that a portion of the carrier film 66" overlies the periphery of the active surface of the semiconductor die 42, not including the bonding sites 44. The conductors extend beyond the edges 65'of the second cavity to overlie the bonding sites 44. The active surface of the die and the top surface of the carrier film 66" occupy non-coplanar but substantially parallel planes. Thus, the thickness of the carrier film 66" provides an intrinsic standoff for the TAB conductors 64 during inner-lead-bonding. A bonding tool 96 is used to thermocompression or thermosonically bond the conductors 64 to the aluminum bonding pads 44, while concurrently downsetting the leads 64. Because of the second cavity which extends over a periphery of active surface of the semiconductor die, the conductors bend at the edge 65'of the second cavity to eliminate the problem of corner passivation damage at the bonding pad 44. An encapsulant (not illustrated) may also be used to protect the die surface and the inner-lead-bonds.

The foregoing description and illustrations contained herein demonstrate many of the advantages associated with the present invention. In particular, it has been revealed that a TAB semiconductor device can be easily manufactured using a self-aligning cavity TAB tape. The inventive TAB tape configuration provides a self-aligning feature in addition to providing an intrinsic standoff to concurrently inner-lead-bond and downset the TAB leads to either bumped or bumpless semiconductor die. Moreover, when the downset cavity in the TAB tape is smaller than the semiconductor die, the gap between the edge of the semiconductor die and the edge of the cavity, which is present in all standard TAB devices, is eliminated. This permits the encapsulant to wet and bond to the polyimide carrier film, thus strengthening the bond interface and improving lead reliability. Yet another advantage is that the present invention permits inner-lead-bonding to bumpless bonding pads with less risk of passivation damage and also allows gang bonding to bumpless semiconductor die.

Thus it is apparent that there has been provided, in accordance with the invention, a TAB semiconductor device with a self-aligning cavity and intrinsic standoff and a method for its manufacture that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, encapsulating materials other than an epoxy may be used for the encapsulant, such as silicones or urethanes. Therefore, it is intended that this invention encompass all such variations and modifications falling within the scope of the appended claims.

I claim:

1. A method for manufacturing a TAB semiconductor device comprising the steps of:

providing a semiconductor die having a plurality of bonding sites on an active surface;

substantially centering the semiconductor die inside a cavity of a TAB tape which comprises a carrier film and a plurality of conductors on a top surface of the carrier film, wherein the cavity has an alignment gap in a range of 0.02 to 0.06 mm with respect to the semiconductor die to substantially self-align the semiconductor die within the cavity, the plurality of conductors extending into the cavity to overlie the plurality of bonding sites, wherein the active surface of the semiconductor die and the top surface of the carrier film occupy non-coplanar but substantially parallel planes;

inner-lead-bonding and concurrently downsetting the plurality of conductors to the plurality of bonding sites using a bonding tool, wherein an edge of the carrier film provides an intrinsic standoff for the downsetting, without assistance of any standoff created by the bonding tool, such that the plurality of conductors bends at the edge of the carrier film beyond an elastic limit of the plurality of conductors in order to contact the plurality of bonding sites on the active surface of the semiconductor die without electrically short-circuiting to an edge of the semiconductor die; and covering the entire active surface of the semiconductor die and a portion of the TAB tape with an encapsulant.

2. The method according to claim 1, wherein the step of inner-lead-bonding comprises a process selected from a group consisting of:

thermocompression bonding and thermosonic bonding.

3. The method according to claim 2, wherein the step of inner-lead-bonding comprises either gang bonding or single point bonding.

4. A method for manufacturing a TAB semiconductor device comprising the steps of:

providing a semiconductor die having a plurality of bonding sites on an active surface, wherein the plurality of bonding sites is a plurality of outermost bonding sites;

substantially centering the semiconductor die below a cavity of a TAB tape which comprises a nonconductive flexible carrier film and a plurality of conductors on a top surface of the carrier film, wherein the cavity is smaller than the semiconductor die, the plurality of conductors extending into the cavity to overlie the plurality of bonding sites, wherein the active surface of the semiconductor die and the top surface of the flexible carrier film occupy non-coplanar but substantially parallel planes and wherein the flexible carrier film abuts and is supported by the active surface of the semiconductor die without overlying the plurality of bonding sites;

inner-lead-bonding and concurrently downsetting the plurality of conductors to the plurality of bonding sites using a bonding tool, wherein an edge of the cavity of the TAB tape in the flexible carrier film provides an intrinsic standoff for the downsetting, without assistance of any standoff created by the bonding tool, such that the plurality of conductors bends at the edge of the cavity beyond an elastic limit of the plurality of conductors in order to contact the plurality of bonding sites on the active surface of the semiconductor die without electrically short-circuiting to an edge of the semiconductor die; and covering the active surface of the semiconductor die and a portion of the TAB tape with an encapsulant.

5. The method according to claim 4, wherein the step of centering is performed with a TAB tape having a polyimide carrier film.

6. The method according to claim 4, wherein the step of inner-lead-bonding comprises a process selected from a group consisting of:

thermocompression bonding and thermosonic bonding.

7. The method according to claim 6, wherein the step of inner-lead-bonding comprises either gang bonding or single point bonding.

8. A method for manufacturing a TAB semiconductor device comprising the steps of:

providing a semiconductor die having a plurality of bonding sites on an active surface, wherein the plurality of bonding sites is a plurality of outermost bonding sites;

substantially centering the semiconductor die inside a first cavity of a TAB tape which comprises a carrier film and a plurality of conductors on a top surface of the carrier film, wherein the first cavity has an alignment gap in a range of 0.02 to 0.06 mm with respect to the semiconductor die to substantially self-align the semiconductor die within the first cavity, the carrier film having a second cavity concentric with the first cavity wherein the second cavity is smaller than the semiconductor die such that a surface of the carrier film abuts and is supported by the active surface of the semiconductor die without overlying the plurality of bonding sites, the plurality of conductors extending over a portion of the active surface of the semiconductor die, wherein the active surface of the semiconductor die, the top surface of the carrier film, and the plurality of conductors occupy non-coplanar but substantially parallel planes;

inner-lead-bonding and concurrently downsetting the plurality of conductors to the plurality of bonding sites using a bonding tool, wherein the carrier film provides an intrinsic standoff for the downsetting, without assistance of any standoff created by the bonding tool, such that the plurality of conductors bends at an edge of the second cavity in order to contact the plurality of bonding sites on the active surface of the semiconductor die without electrically short-circuiting to an edge of the semiconductor die; and covering the active surface of the semiconductor die and a portion of the plurality of conductors with an encapsulant.

9. The method according to claim 8, wherein the step of centering is performed with a TAB tape having a polyimide carrier film.

10. The method according to claim 8, wherein the step of inner-lead-bonding comprises a process selected from a group consisting of:

thermocompression bonding and thermosonic bonding.

11. The method according to claim 10, wherein the step of inner-lead-bonding comprises either gang bonding or single point bonding.

12. The method of claim 11 wherein the step of providing a semiconductor die comprises providing a semiconductor die having a plurality of conductive bumps formed on the plurality of bonding sites.

13. The method of claim 4 wherein the step of providing a semiconductor die comprises providing a semiconductor die having a plurality of conductive bumps formed on the plurality of bonding sites.

14. The method of claim 8 wherein the step of providing a semiconductor die comprises providing a semiconductor die having a plurality of conductive bumps formed on the plurality of bonding sites.

* * * * *

UNITED STATES PATENT AND TRADEMARK OFFICE
CERTIFICATE OF CORRECTION

PATENT NO. : 5,686,352
DATED : November 11, 1997
INVENTOR(S) : Leo M. Higgins, III It is certified that error appears in the above-identified patent and that said Letters Patent is hereby corrected as shown below:

Column 9, line 8: Delete "11", replace with --1--

Signed and Sealed this

Twenty-ninth Day of September, 1998

Attest:

BRUCE LEHMAN

Attesting Officer

Commissioner of Patents and Trademarks